(12) United States Patent
Rana

(10) Patent No.: US 10,050,524 B1
(45) Date of Patent: Aug. 14, 2018

(54) CIRCUIT FOR LEVEL SHIFTING A CLOCK SIGNAL USING A VOLTAGE MULTIPLIER

(71) Applicant: STMicroelectronics International N.V., Schiphol (NL)

(72) Inventor: Vikas Rana, Noida (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/800,896

(22) Filed: Nov. 1, 2017

(51) Int. Cl.
  *H02M 3/18* (2006.01)
  *H02M 3/07* (2006.01)
  *H01L 27/092* (2006.01)
  *H01L 27/06* (2006.01)
  *H01L 27/02* (2006.01)

(52) U.S. Cl.
  CPC ........ *H02M 3/073* (2013.01); *H01L 27/0222* (2013.01); *H01L 27/0623* (2013.01); *H01L 27/092* (2013.01)

(58) Field of Classification Search
  None
  See application file for complete search history.

(56) References Cited

U.S. PATENT DOCUMENTS

| | | | | |
|---|---|---|---|---|
| 3,761,899 A | * | 9/1973 | McKenny | G11C 11/405 257/E27.084 |
| 4,053,821 A | * | 10/1977 | Hose, Jr. | G04G 19/04 363/60 |
| 4,199,806 A | * | 4/1980 | Patterson, III | H02M 3/07 363/60 |
| 4,236,199 A | * | 11/1980 | Stewart | H02M 3/073 331/108 C |
| 4,703,500 A | * | 10/1987 | Pollard | H03F 3/2171 379/252 |
| 4,748,295 A | * | 5/1988 | Rogers | G06F 3/044 178/19.03 |
| 4,922,402 A | * | 5/1990 | Olivo | G11C 5/145 307/110 |
| 4,970,409 A | * | 11/1990 | Wada | G11C 5/145 307/110 |
| 5,003,197 A | * | 3/1991 | Nojima | G05F 3/205 327/536 |
| 5,058,063 A | * | 10/1991 | Wada | G11C 16/0433 365/185.06 |
| 5,280,420 A | * | 1/1994 | Rapp | G11C 5/145 363/59 |
| 5,426,334 A | * | 6/1995 | Skovmand | H02M 3/073 323/349 |
| 5,481,221 A | * | 1/1996 | Gariboldi | H02M 3/07 327/530 |

(Continued)

*Primary Examiner* — David E Graybill
(74) *Attorney, Agent, or Firm* — Crowe & Dunlevy

(57) ABSTRACT

A voltage multiplier circuit operates in response to a received clock signal to perform a voltage multiplication operation on an input voltage to generate an output voltage. The voltage multiplier circuit includes a pair of intermediate nodes that are capacitively coupled to receive, respectively, opposite phases of a clock signal. A first CMOS driver circuit is coupled to one of the intermediate nodes and has an output configured to generate one phase of a level shifted output clock signal. A second CMOS driver circuit is coupled to another one of the intermediate nodes and has an output configured to generate another phase of the level shifted output clock signal.

37 Claims, 11 Drawing Sheets

(56) References Cited

U.S. PATENT DOCUMENTS

| | | | | |
|---|---|---|---|---|
| 5,581,455 A * | 12/1996 | Rossi | ............ | H02M 3/07 327/536 |
| 5,914,632 A * | 6/1999 | Fotouhi | ............ | H02M 3/07 327/390 |
| 6,232,752 B1 * | 5/2001 | Bissell | ............ | H02M 3/1582 323/222 |
| 6,282,135 B1 * | 8/2001 | Proebsting | ............ | G11C 7/065 257/E21.659 |
| 6,483,728 B1 * | 11/2002 | Johnson | ............ | H02M 3/073 363/60 |
| 6,525,949 B1 * | 2/2003 | Johnson | ............ | H02M 3/073 363/60 |
| 7,199,641 B2 * | 4/2007 | Wei | ............ | H02M 3/073 327/293 |
| 7,304,530 B2 * | 12/2007 | Wei | ............ | H02M 3/073 327/390 |
| 7,719,343 B2 * | 5/2010 | Burgener | ............ | H02M 3/073 327/536 |
| 8,085,604 B2 * | 12/2011 | Ng | ............ | H01L 27/0266 365/189.05 |
| 8,154,333 B2 * | 4/2012 | Ker | ............ | G11C 5/145 327/536 |
| 8,362,824 B2 * | 1/2013 | Wong | ............ | H02M 3/073 327/536 |
| 8,378,736 B2 * | 2/2013 | Burgener | ............ | H02M 3/073 327/536 |
| 8,378,737 B2 * | 2/2013 | Ker | ............ | G11C 5/145 327/536 |
| 8,441,841 B2 * | 5/2013 | Nagatsuka | ............ | G11C 11/413 365/149 |
| 8,482,340 B2 * | 7/2013 | Shay | ............ | H02M 3/07 327/536 |
| 9,209,757 B1 | 12/2015 | Thandri et al. | | |
| 9,634,562 B1 | 4/2017 | Rana et al. | | |
| 2001/0033254 A1 * | 10/2001 | Furusato | ............ | G06F 3/0414 345/55 |
| 2003/0141530 A1 | 7/2003 | Kaneko et al. | | |
| 2003/0146476 A1 | 8/2003 | Kaneko et al. | | |
| 2003/0164511 A1 | 9/2003 | Kaneko et al. | | |
| 2003/0173609 A1 | 9/2003 | Kaneko et al. | | |
| 2004/0246044 A1 | 12/2004 | Myono et al. | | |
| 2004/0246246 A1 * | 12/2004 | Tobita | ............ | G09G 3/20 345/205 |
| 2005/0052220 A1 * | 3/2005 | Burgener | ............ | H02M 3/073 327/536 |
| 2005/0062520 A1 | 3/2005 | Kim et al. | | |
| 2007/0001746 A1 * | 1/2007 | Wei | ............ | H02M 3/073 327/536 |
| 2007/0096796 A1 * | 5/2007 | Firmansyah | ............ | H02M 3/07 327/536 |
| 2008/0048765 A1 | 2/2008 | Nonaka | | |
| 2008/0100370 A1 * | 5/2008 | Chen | ............ | H02M 3/073 327/536 |
| 2008/0150619 A1 | 6/2008 | Lesso et al. | | |
| 2008/0174360 A1 * | 7/2008 | Hsu | ............ | H02M 3/073 327/536 |
| 2008/0238535 A1 | 10/2008 | Horibata | | |
| 2009/0080257 A1 | 3/2009 | Oka et al. | | |
| 2009/0289731 A1 * | 11/2009 | Yang | ............ | H01P 7/005 331/117 FE |
| 2010/0214010 A1 * | 8/2010 | Burgener | ............ | H02M 3/073 327/536 |
| 2010/0277152 A1 | 11/2010 | MacFarlane | | |
| 2010/0327959 A1 | 12/2010 | Lee | | |
| 2011/0050327 A1 | 3/2011 | Fujitani | | |
| 2011/0084757 A1 | 4/2011 | Saman et al. | | |
| 2011/0121864 A1 | 5/2011 | Maeda et al. | | |
| 2011/0234306 A1 | 9/2011 | Hioka et al. | | |
| 2012/0062291 A1 * | 3/2012 | Saitoh | ............ | H04L 7/033 327/157 |
| 2012/0249224 A1 | 10/2012 | Wei et al. | | |
| 2013/0093503 A1 | 4/2013 | Kok et al. | | |
| 2013/0113546 A1 * | 5/2013 | Shay | ............ | H02M 3/07 327/536 |
| 2013/0314151 A1 | 11/2013 | Lesso | | |
| 2013/0328824 A1 | 12/2013 | Krah et al. | | |
| 2014/0055194 A1 * | 2/2014 | Burgener | ............ | H02M 3/073 327/536 |
| 2015/0002214 A1 | 1/2015 | Englekirk | | |
| 2015/0015323 A1 | 1/2015 | Rahman et al. | | |
| 2015/0214837 A1 | 7/2015 | Ogawa | | |
| 2015/0270775 A1 | 9/2015 | Ma | | |
| 2015/0372590 A1 | 12/2015 | Seshita | | |
| 2016/0191022 A1 * | 6/2016 | Burgener | ............ | H02M 3/073 327/536 |
| 2017/0271972 A1 * | 9/2017 | Zhao | ............ | H02M 1/088 |

\* cited by examiner

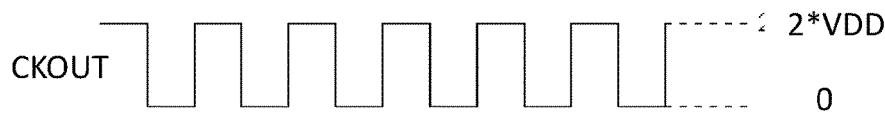
FIG. 12
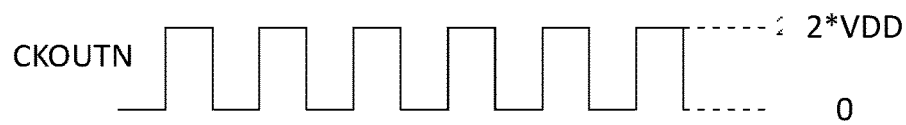
FIG. 14
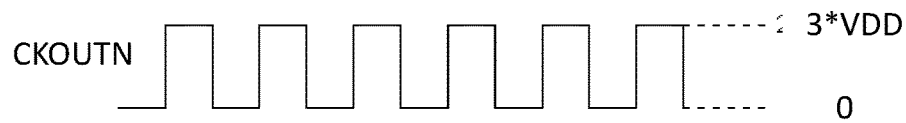
FIG. 16
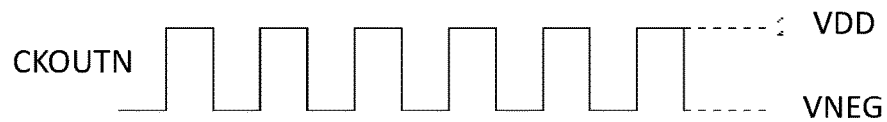
FIG. 18
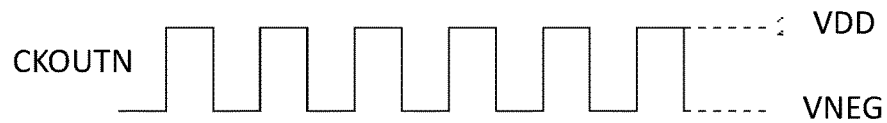

US 10,050,524 B1

CIRCUIT FOR LEVEL SHIFTING A CLOCK SIGNAL USING A VOLTAGE MULTIPLIER

TECHNICAL FIELD

The present invention relates to level shifting circuits and, in particular, to a circuit for level shifting a clock signal using a voltage multiplier.

BACKGROUND

It is now commonplace for an integrated circuit to include multiple supply voltage domains. For example, a first functional circuit of the integrated circuit may operate in a first supply voltage domain with a supply voltage at a first voltage level and a second functional circuit of the integrated circuit may operate in a second supply voltage domain with a supply voltage at a second voltage level that is different (higher or lower) than the first voltage level. Both the first functional circuit and the second functional circuit may be clocked circuits that respond to a clock signal. Because those functional circuits operate in different supply voltage domains, the clock signal must be level shifted so as to properly drive circuit operation in each supply voltage domain. However, it is critical that the level shifting operation not distort the frequency of the clock signal. There is a need in the art for a level shifting circuit that can level shift high frequency clock signals between supply voltage domains without introducing frequency distortion.

SUMMARY

In an embodiment, a circuit comprises: a voltage multiplier circuit have an input voltage node configured to receive a first voltage and an output voltage node configured to generate a second voltage multiplied from said first voltage and including: first and second intermediate nodes that are capacitively coupled to receive opposite phases of a first clock signal, respectively, whose voltage varies between a ground voltage and first voltage level; and third and fourth intermediate nodes are capacitively coupled to receive opposite phases of a second clock signal, respectively, whose voltage varies between the ground voltage and a second voltage level greater than the first voltage level; a first CMOS driver circuit having an input coupled to said first intermediate node, a first source terminal coupled to receive a level shift voltage, a second source terminal, and an output configured to generate one phase of a third clock signal that is level shifted from said first clock signal; and a second CMOS driver circuit having an input coupled to said second intermediate node, a first source terminal coupled to receive a level shift voltage, a second source terminal, and an output configured to generate another phase of the third clock signal that is level shifted from said first clock signal.

In an embodiment, a circuit comprises: a voltage multiplier circuit have an input voltage node configured to receive a first voltage and an output voltage node configured to generate a second voltage multiplied from said first voltage and including: first and second intermediate nodes that are capacitively coupled to receive opposite phases of a first clock signal, respectively, whose voltage varies between a ground voltage and first voltage level; and third and fourth intermediate nodes are capacitively coupled to receive opposite phases of a second clock signal, respectively, whose voltage varies between the ground voltage and a second voltage level greater than the first voltage level; a first CMOS driver circuit having an input coupled to a reference voltage, a first source terminal coupled to one of the first or third intermediate nodes, a second source terminal coupled to receive a phase of the first clock signal, and an output configured to generate one phase of a third clock signal that is level shifted from said first clock signal; and a second CMOS driver circuit having an input coupled to said reference voltage a first source terminal coupled to one of the second or fourth intermediate nodes, a second source terminal coupled to receive another phase of the first clock signal, and an output configured to generate another phase of the third clock signal that is level shifted from said first clock signal.

In an embodiment, a circuit comprises: a voltage multiplier circuit have an input voltage node configured to receive a first voltage and an output voltage node configured to generate a second voltage multiplied from said first voltage and including: first and second intermediate nodes that are capacitively coupled to receive opposite phases of a first clock signal, respectively, whose voltage varies between a ground voltage and first voltage level; and third and fourth intermediate nodes are capacitively coupled to receive opposite phases of a second clock signal, respectively, whose voltage varies between the ground voltage and a second voltage level greater than the first voltage level; a first CMOS driver circuit having an input coupled to said third intermediate node, a first source terminal coupled to receive a level shift voltage, a second source terminal, and an output configured to generate one phase of a third clock signal that is level shifted from said first clock signal; and a second CMOS driver circuit having an input coupled to said fourth intermediate node, a first source terminal coupled to receive a level shift voltage, a second source terminal, and an output configured to generate another phase of the third clock signal that is level shifted from said first clock signal.

BRIEF DESCRIPTION OF THE DRAWINGS

For a better understanding of the embodiments, reference will now be made by way of example only to the accompanying figures in which:

FIG. 12 shows level shifted clock signal waveforms generated by the circuit of FIG. 11;

FIG. 14 shows level shifted clock signal waveforms generated by the circuit of FIG. 13;

FIG. 16 shows level shifted clock signal waveforms generated by the circuit of FIG. 15;

FIG. 18 shows level shifted clock signal waveforms generated by the circuit of FIG. 17.

DETAILED DESCRIPTION OF THE DRAWINGS

Figure 1:
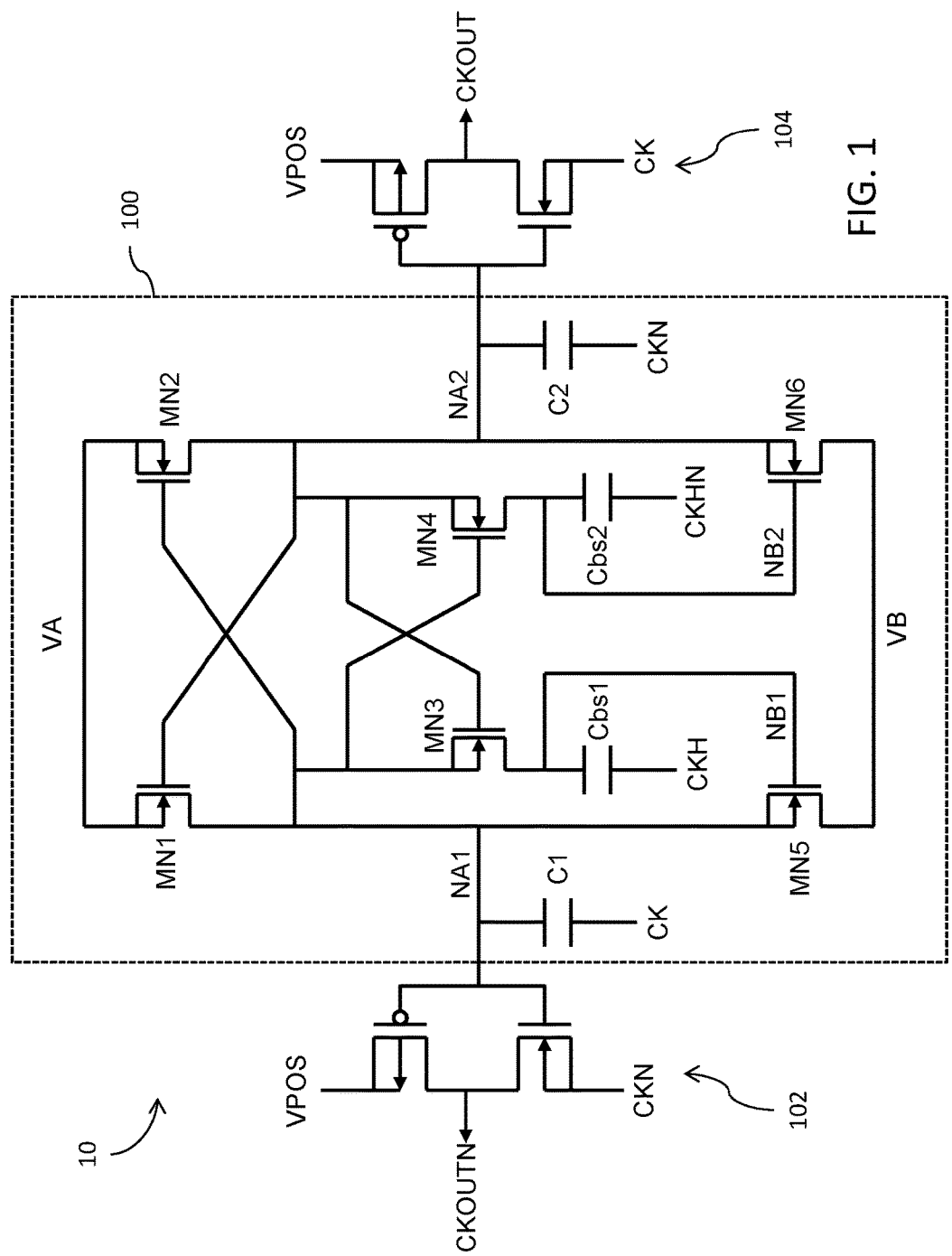
FIG. 1 shows a circuit diagram for a clock level shifter circuit.

Reference is now made to FIG. 1 showing a circuit diagram for a clock level shifter 10. The clock level shifter 10 includes a voltage multiplier circuit 100, a first CMOS driver circuit 102 and a second CMOS driver circuit 104. The clock level shifter 10 receives an input clock signal CK/CKN that varies between a first set of voltage levels and produces an output clock signal CKOUT/CKOUTN that varies between a second set of voltage levels different from the first set of voltage levels. In an example, the first set of voltage levels may be 0 and VDD volts and the second set of voltage levels may be 0 and VPOS volts, where VPOS volts is less than or equal to about 2*VDD volts.

The voltage multiplier circuit 100 includes an n-channel MOS transistor MN1 having a source terminal coupled to node VA, functioning here as a voltage input node, and a drain terminal coupled to node NA1 and an n-channel MOS transistor MN2 having a source terminal coupled to node VA and a drain terminal coupled to node NA2. The transistors MN1 and MN2 are cross-coupled with the gate terminal of transistor MN1 coupled to the drain terminal of transistor MN2 at node NA2 and the gate terminal of transistor MN2 coupled to the drain terminal of transistor MN1 at node NA1.

The circuit 100 further includes an n-channel MOS transistor MN3 having a source terminal coupled to node NA1 and a drain terminal coupled to node NB1 and an n-channel MOS transistor MN4 having a source terminal coupled to node NA2 and a drain terminal coupled to node NB2. The transistors MN3 and MN4 are cross-coupled with the gate terminal of transistor MN3 coupled to the source terminal of transistor MN4 at node NA2 and the gate terminal of transistor MN4 coupled to the source terminal of transistor MN3 at node NA1.

The circuit 100 still further includes an n-channel MOS transistor MN5 having a drain terminal coupled to node VB and a source terminal coupled to node NA1 and an n-channel MOS transistor MN6 having a drain terminal coupled to node VB, functioning here as a voltage output node, and a source terminal coupled to node NA2. The gate terminal of transistor MN5 is coupled to node NB1 and the gate terminal of transistor MN6 is coupled to node NB2.

A capacitor C1 has one terminal coupled to node NA1 and another terminal coupled to receive a clock signal CK. A capacitor C2 has one terminal coupled to node NA2 and another terminal coupled to receive a clock signal CKN (which is a logical inversion of the clock signal CK). A bootstrap capacitor Cbs1 has one terminal coupled to node NB1 and another terminal coupled to receive a clock signal CKH. A bootstrap capacitor Cbs2 has one terminal coupled to node NB2 and another terminal coupled to receive a clock signal CKHN (which is a logical inversion of the clock signal CHK).

The first CMOS driver circuit 102 is configured as a CMOS inverter having an input coupled to the node NA1 and an output generating the level shifted clock signal CKOUTN. A source terminal of the p-channel MOS transistor in first CMOS driver circuit 102 is coupled to the positive supply voltage VPOS to which the clock is being level shifted and a source terminal of the n-channel MOS transistor in first CMOS driver circuit 102 is coupled to receive the clock signal CKN.

The second CMOS driver circuit 104 is configured as a CMOS inverter having an input coupled to the node NA2 and an output generating the level shifted clock signal CKOUT. A source terminal of the p-channel MOS transistor in second CMOS driver circuit 104 is coupled to the positive supply voltage VPOS to which the clock is being level shifted and a source terminal of the n-channel MOS transistor in second CMOS driver circuit 104 is coupled to receive the clock signal CK.

Figure 2:
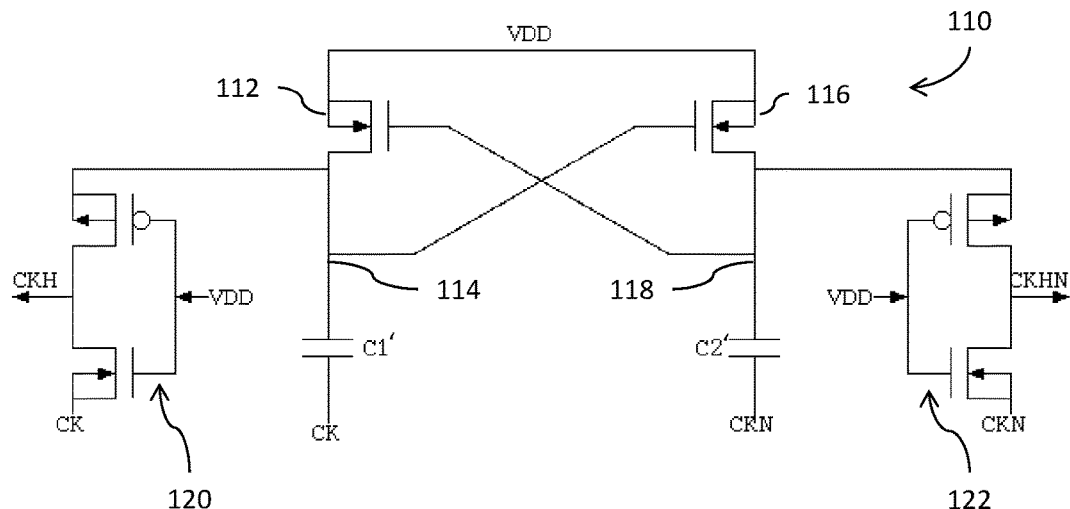
FIG. 2 is a circuit diagram for a clock voltage boosting circuit.

The clock signals CKH and CKHN are generated from the clock signals CK and CKN using a clock voltage boosting circuit 110 shown in FIG. 2. The circuit 110 includes an n-channel MOS transistor 112 having a source terminal coupled to a positive supply voltage node VDD and a drain terminal coupled to node 114 and an n-channel MOS transistor 116 having a source terminal coupled to the VDD node and a drain terminal coupled to node 118. The transistors 112 and 116 are cross-coupled with the gate terminal of transistor 112 coupled to the drain terminal of transistor 116 at node 118 and the gate terminal of transistor 116 coupled to the drain terminal of transistor 112 at node 114.

A capacitor C1' has one terminal coupled to node 114 and another terminal coupled to receive the clock signal CK. A capacitor C2' has one terminal coupled to node 118 and another terminal coupled to receive the clock signal CKN.

A CMOS inverter 120 has an input coupled to the VDD node and an output generating the clock signal CKH. A source terminal of the p-channel MOS transistor in inverter 120 is coupled to the node 114 and a source terminal of the n-channel MOS transistor in inverter 120 is coupled to receive the clock signal CK.

A CMOS inverter 122 has an input coupled to the VDD node and an output generating the clock signal CKHN. A source terminal of the p-channel MOS transistor in inverter 122 is coupled to the node 118 and a source terminal of the n-channel MOS transistor in inverter 122 is coupled to receive the clock signal CKN.

Figure 3A:
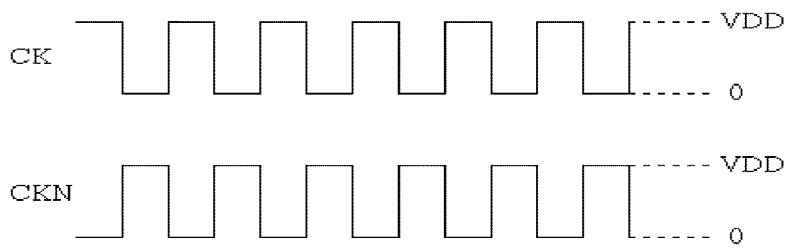
FIGS. 3A and 3B show clock signal waveforms.
Figure 3B:
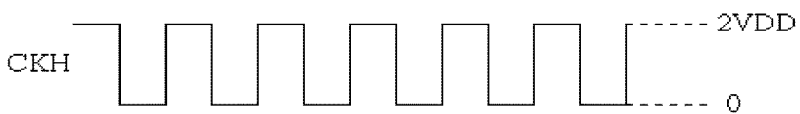

The clock voltage boosting circuit 110 functions to level shift the clock signals CK and CKN to generate the clock signals CKH and CKHN. FIG. 3A shows the waveforms for the clock signals CK and CKN. FIG. 3B shows the waveforms for the clock signals CKH and CKHN. It will be noted that the clock voltage boosting circuit 110 functions to boost the high voltage level of the clock signals CKH and CKHN to 2*VDD, with the high voltage level of the clock signals CK and CKN being VDD. The clock signals CKH and CKHN have a same phase as the clock signals CK and CKN, respectively.

Figure 4:
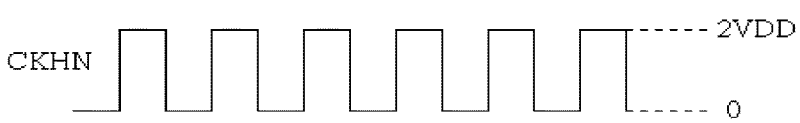
FIG. 4 shows level shifted clock signal waveforms generated by the circuit of FIG. 1.
Figure 4:
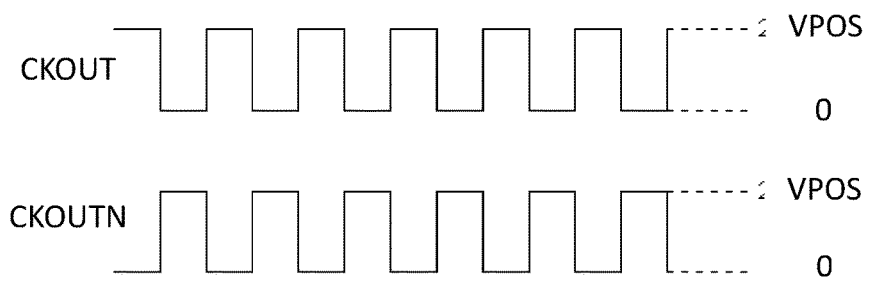

For level shifting the clock signal CK/CKN from the VDD voltage level to generate the level shifted clock signals CKOUT/CKOUTN at the VPOS voltage level, the VDD supply voltage is applied to node VA (the voltage input node). The voltage multiplier circuit 100 operates as a positive voltage doubler (i.e., operating in a high positive voltage mode) and a high positive voltage of 2*VDD is generated at node VB (the voltage output node). This high positive voltage may, for example, be used as an on-chip boosted supply voltage for functional circuits. The VPOS voltage level is preferably less than or equal to 2*VDD. The level shifted clock signal CKOUT/CKOUTN will vary been 0 volts and VPOS volts at a frequency matching the frequency of the clock signal CK/CKN and with an in-phase relationship (where CKOUTN is in phase with CKN and CKOUT is in phase with CK). FIG. 4 shows the waveforms for the clock signals CKOUT/CKOUTN.

The voltage multiplier circuit 100 advantageously operates as a positive voltage doubler (i.e., operating in a high positive voltage mode) from just two clocks (CK/CKH and CKN/CKNH) as follows:

To begin, assume that no clock is present. In this situation, the nodes NA1 and NA2 will be charged to the VDD−Vt voltage level, where Vt is the threshold voltage of the n-channel MOS transistors MN1 and MN2. Now, assume the clock signal is applied. With the clock signal CK at the VDD voltage level and the clock signal CKN at the 0 (ground GND) voltage level, then the clock signal CKH is at the 2*VDD voltage level and the clock signal CKHN is at the 0 voltage level. In this configuration, the node NA1 will shift to the 2*VDD−Vt voltage level and the node NA2 will shift to the VDD voltage level. Due to the cross coupling between transistors MN3 and MN4, the node NB1 will be charged to the 3*VDD voltage level and the node NB2 will be charged to the VDD voltage level. As the node NB1 is at the 3*VDD voltage level and the node NA1 is at the 2*VDD voltage level, the n-channel MOS transistor MN5 has sufficient Vgs (gate to source voltage) to pass the 2*VDD voltage from node NA1 to the voltage output node VB. In this way, a high positive voltage (higher than input supply voltage VDD) is generated and passed for output at the voltage output node VB. So, during high positive voltage mode operation, the voltage VDD is applied at the voltage input node VA and the 2*VDD voltage is generated at the voltage output node VB. During the opposite phase of the clocks, the nodes NA1 and NA2 switch between the VDD voltage level and the 2*VDD voltage level. Similarly, the nodes NB1 and NB2 switch between the VDD voltage level and the 3*VDD voltage level.

It will be noted that the foregoing voltage levels are mentioned with the assumption of an ideal operating situation when there is no current load at the output and there is no charge loss.

Figure 5:
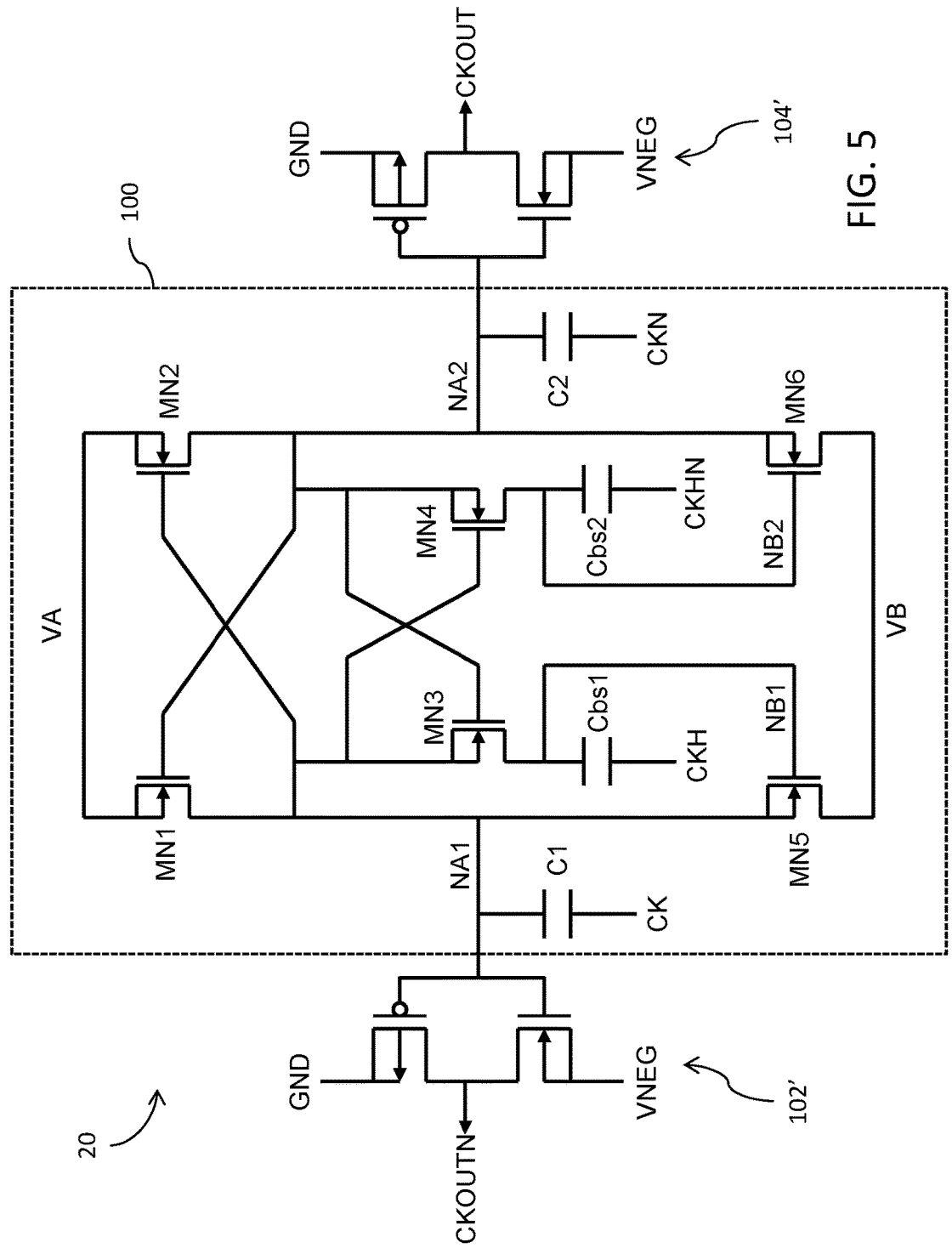
FIG. 5 shows a circuit diagram for a clock level shifter circuit.

Reference is now made to FIG. 5 showing a circuit diagram for a clock level shifter 20. Like reference numbers refer to like or similar components. The clock level shifter 20 differs from the clock level shifter 10 of FIG. 1 with respect to the applied source terminal voltages for the first CMOS driver circuit 102' and second CMOS driver circuit 104' and the applied supply voltage for the multiplier circuit 100. The clock level shifter 20 also differs in that the node VB is the voltage input node and the node VA is the voltage output node. The clock level shifter 20 receives an input clock signal CK/CKN that varies between a first set of voltage levels and produces an output clock signal CKOUT/CKOUTN that varies between a second set of voltage levels different from the first set of voltage levels. In an example, the first set of voltage levels may be 0 and VDD volts and the second set of voltage levels may be 0 and VNEG volts, where VNEG volts is greater than or equal to about −VDD volts.

The first CMOS driver circuit 102' is configured as a CMOS inverter having an input coupled to the node NA1 and an output generating the level shifted clock signal CKOUTN. A source terminal of the p-channel MOS transistor in first CMOS driver circuit 102' is coupled to the ground supply voltage GND and a source terminal of the n-channel MOS transistor in first CMOS driver circuit 102' is coupled to the negative supply voltage VNEG to which the clock is being level shifted.

The second CMOS driver circuit 104' is configured as a CMOS inverter having an input coupled to the node NA2 and an output generating the level shifted clock signal CKOUT. A source terminal of the p-channel MOS transistor in second CMOS driver circuit 104' is coupled to the ground supply voltage GND and a source terminal of the n-channel MOS transistor in second CMOS driver circuit 104' is coupled to the negative supply voltage VNEG to which the clock is being level shifted.

Figure 6:
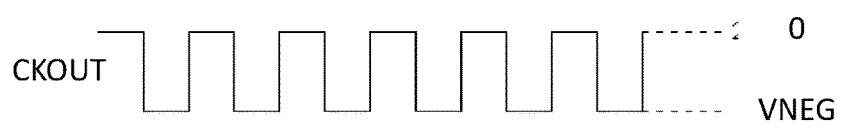
FIG. 6 shows level shifted clock signal waveforms generated by the circuit of FIG. 5.
Figure 6:
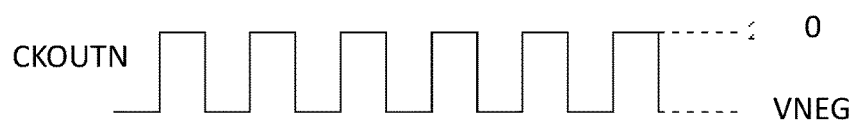

For level shifting the clock signal CK/CKN from the VDD voltage level to generate the level shifted clock signals CKOUT/CKOUTN at the VNEG voltage level, the GND supply voltage is applied to node VB (the voltage input node). The voltage multiplier circuit 100 operates as a negative voltage doubler (i.e., operating in a high negative voltage mode) and a high negative voltage of −VDD is generated at node VA (the voltage output node). This high negative voltage may, for example, be used as an on-chip boosted supply voltage for functional circuits. The VNEG voltage level is preferably greater than or equal to −VDD. The level shifted clock signal CKOUT/CKOUTN will vary been 0 volts and VNEG volts at a frequency matching the frequency of the clock signal CK/CKN and with an in-phase relationship (where CKOUTN is in phase with CKN and CKOUT is in phase with CK). FIG. 6 shows the waveforms for the clock signals CKOUT/CKOUTN.

The voltage multiplier circuit 100 advantageously operates as a negative voltage doubler (i.e., operating in a high negative voltage mode) from just two clocks (CK/CKH and CKN/CKNH) as follows:

With the ground reference voltage GND applied to the voltage input node VB, when the clock signal CKH transitions to the 2*VDD voltage level, the clock signal CK is simultaneously at the VDD voltage level, and the n-channel MOS transistor MN5 turns on and node NA1 is charged to the 0 (GND) voltage level. During the next clock cycle, the clock signal CKH switches from the 2*VDD voltage level to the 0 voltage level, with the clock signal CK changing state from the VDD voltage level to 0 voltage level, and the node NA1 accordingly transitions from the 0 voltage level to the −VDD voltage level. Also, the node NB1 discharges to the −VDD voltage level via the transistor MN3 and the switch off of the transistor MN5. In this way, the node NA1 also goes to the −VDD voltage level. Due to effect of the clock signals CKN and CKHN, the node NA2 is charged to the 0 (GND) voltage level via transistor MN6. As the NA2 is at the 0 voltage level, and the NA1 is at the −VDD voltage level, this configuration causes the transistor MN1 to turn on and pass the −VDD voltage level voltage to the voltage output node VA. During this negative high voltage mode of operation, the nodes NA1 and NA2 switch between the 0 voltage level and the −VDD voltage level, and vice versa. Similarly, the nodes NB1 and NB2 switch between the VDD voltage level and the −VDD voltage level, and vice versa.

It will be noted that the foregoing voltage levels are mentioned with the assumption of an ideal operating situation when there is no current load at the output and there is no charge loss.

Figure 7:
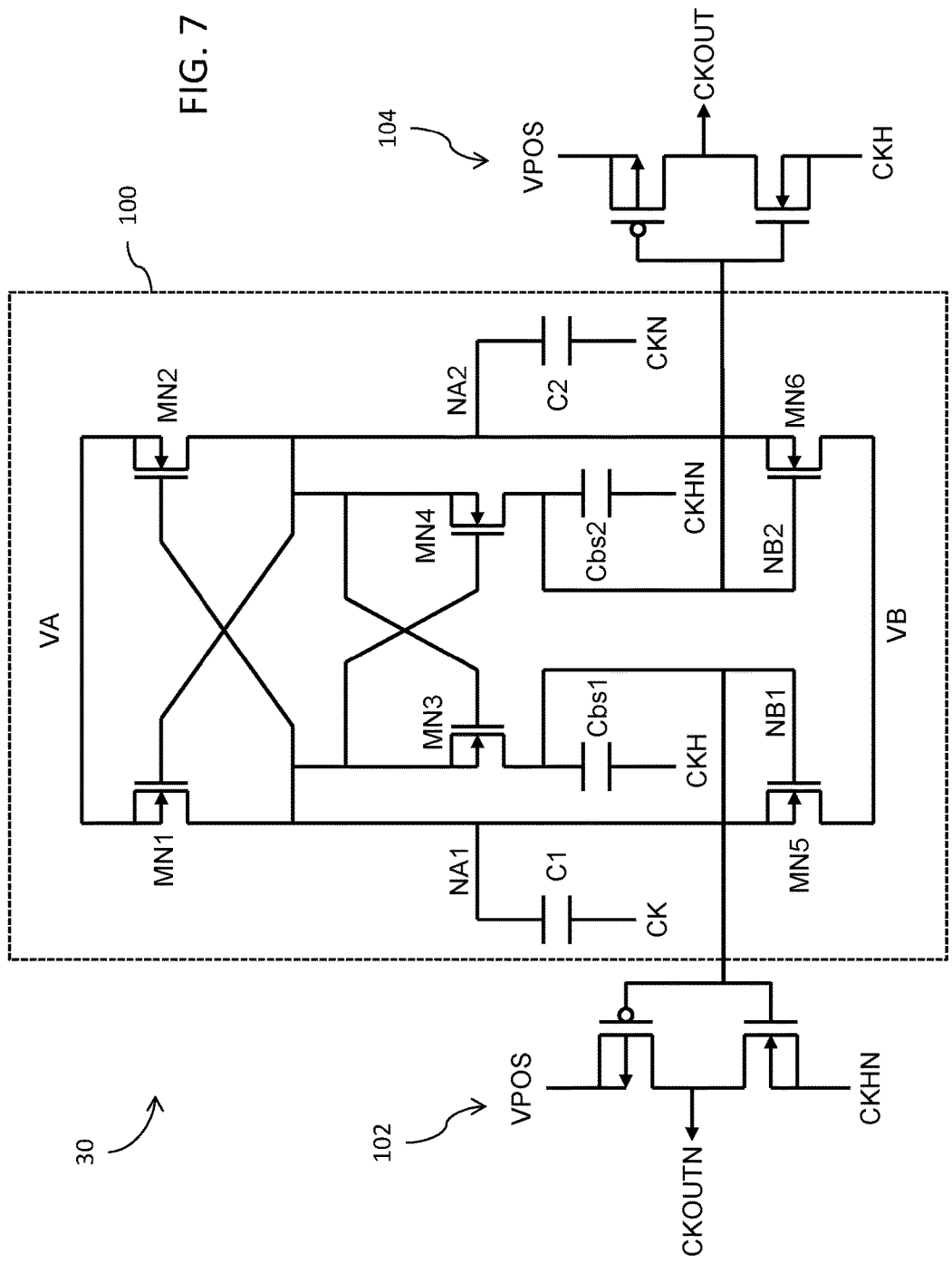
FIG. 7 shows a circuit diagram for a clock level shifter circuit.

Reference is now made to FIG. 7 showing a circuit diagram for a clock level shifter 30. Like reference numbers refer to like or similar components. The clock level shifter 30 differs from the clock level shifter 10 of FIG. 1 with respect to the input connection of the first CMOS driver circuit 102 and second CMOS driver circuit 104. The clock level shifter 30 receives an input clock signal CK/CKN that varies between a first set of voltage levels and produces an output clock signal CKOUT/CKOUTN that varies between a second set of voltage levels different from the first set of voltage levels. In an example, the first set of voltage levels may be 0 and VDD volts and the second set of voltage levels may be 0 and VPOS volts, where VPOS volts is less than or equal to about 3*VDD volts.

The first CMOS driver circuit 102 is configured as a CMOS inverter having an input coupled to the node NB1 and an output generating the level shifted clock signal CKOUTN. A source terminal of the p-channel MOS transistor in first CMOS driver circuit 102 is coupled to the positive supply voltage VPOS to which the clock is being level shifted and a source terminal of the n-channel MOS transistor in first CMOS driver circuit 102 is coupled to receive the clock signal CKHN.

The second CMOS driver circuit 104 is configured as a CMOS inverter having an input coupled to the node NB2 and an output generating the level shifted clock signal CKOUT. A source terminal of the p-channel MOS transistor in second CMOS driver circuit 104 is coupled to the positive supply voltage VPOS to which the clock is being level shifted and a source terminal of the n-channel MOS transistor in second CMOS driver circuit 104 is coupled to receive the clock signal CKH.

Figure 8:
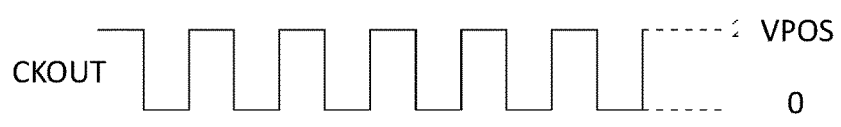
FIG. 8 shows level shifted clock signal waveforms generated by the circuit of FIG. 7.
Figure 8:
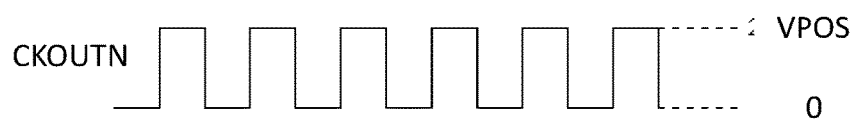

For level shifting the clock signal CK/CKN from the VDD voltage level to generate the level shifted clock signals CKOUT/CKOUTN at the VPOS voltage level, the VDD supply voltage is applied to node VA (the input voltage node). The voltage multiplier circuit 100 operates as a positive voltage doubler (i.e., operating in a high positive voltage mode) and a high positive voltage of 2*VDD is generated at node VB (the output voltage node). This high positive voltage may, for example, be used as an on-chip boosted supply voltage for functional circuits. The VPOS voltage level is preferably less than or equal to 3*VDD. The level shifted clock signal CKOUT/CKOUTN will vary been 0 volts and VPOS volts at a frequency matching the frequency of the clock signal CK/CKN and with an in-phase relationship (where CKOUTN is in phase with CKN and CKOUT is in phase with CK). FIG. 8 shows the waveforms for the clock signals CKOUT/CKOUTN.

Figure 9:
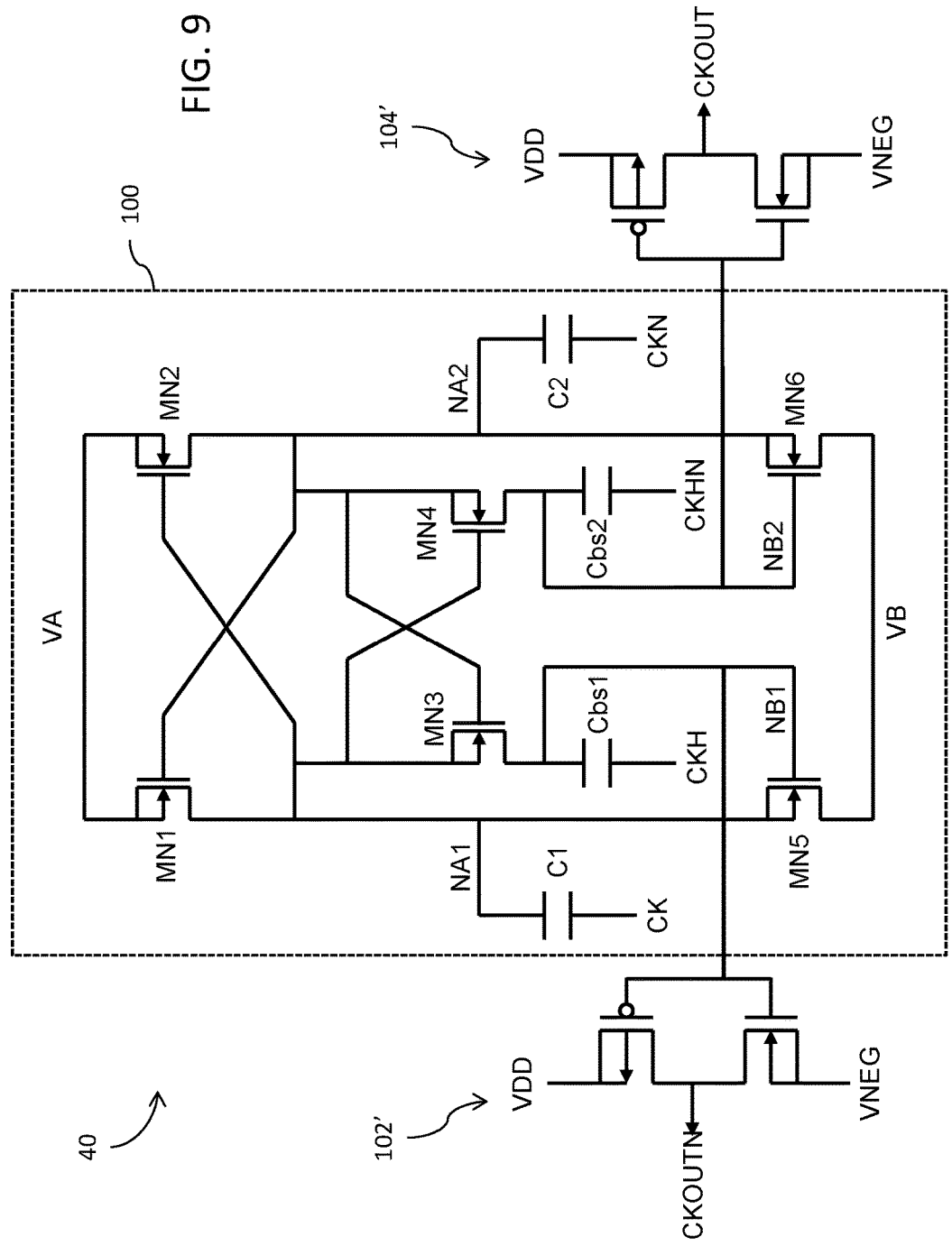
FIG. 9 shows a circuit diagram for a clock level shifter circuit.

Reference is now made to FIG. 9 showing a circuit diagram for a clock level shifter 40. Like reference numbers refer to like or similar components. The clock level shifter 40 differs from the clock level shifter 30 of FIG. 7 with respect to the applied source terminal voltages for the first CMOS driver circuit 102' and second CMOS driver circuit 104' and the applied supply voltage for the multiplier circuit 100. The clock level shifter 40 also differs in that the node VB is the voltage input node and the node VA is the voltage output node. The clock level shifter 40 receives an input clock signal CK/CKN that varies between a first set of voltage levels and produces an output clock signal CKOUT/CKOUTN that varies between a second set of voltage levels different from the first set of voltage levels. In an example, the first set of voltage levels may be 0 and VDD volts and the second set of voltage levels may be VDD and VNEG volts, where VNEG volts is greater than or equal to about −VDD volts.

The first CMOS driver circuit 102' is configured as a CMOS inverter having an input coupled to the node NB1 and an output generating the level shifted clock signal CKOUTN. A source terminal of the p-channel MOS transistor in first CMOS driver circuit 102' is coupled to the VDD supply voltage and a source terminal of the n-channel MOS transistor in first CMOS driver circuit 102' is coupled to the negative supply voltage VNEG to which the clock is being level shifted.

The second CMOS driver circuit 104' is configured as a CMOS inverter having an input coupled to the node NB2 and an output generating the level shifted clock signal CKOUT. A source terminal of the p-channel MOS transistor in second CMOS driver circuit 104' is coupled to the VDD supply voltage and a source terminal of the n-channel MOS transistor in second CMOS driver circuit 104' is coupled to the negative supply voltage VNEG to which the clock is being level shifted.

Figure 10:
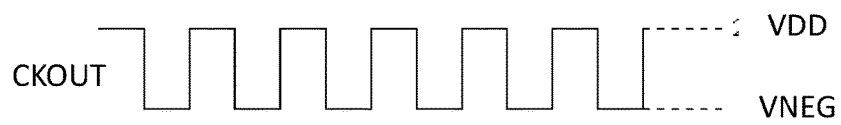
FIG. 10 shows level shifted clock signal waveforms generated by the circuit of FIG. 9.
Figure 10:
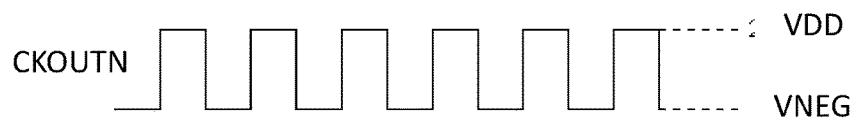

For level shifting the clock signal CK/CKN from the VDD voltage level to generate the level shifted clock signals CKOUT/CKOUTN at the VNEG voltage level, the GND supply voltage is applied to node VB (the input voltage node). The voltage multiplier circuit 100 operates as a negative voltage doubler (i.e., operating in a high negative voltage mode) and a high negative voltage of −VDD is generated at node VA (the output voltage node). This high negative voltage may, for example, be used as an on-chip boosted supply voltage for functional circuits. The VNEG voltage level is preferably greater than or equal to −VDD. The level shifted clock signal CKOUT/CKOUTN will vary been VDD volts and VNEG volts at a frequency matching the frequency of the clock signal CK/CKN and with an in-phase relationship (where CKOUT is in phase with CK and CKOUTN is in phase with CKN). FIG. 10 shows the waveforms for the clock signals CKOUT/CKOUTN.

Figure 11:
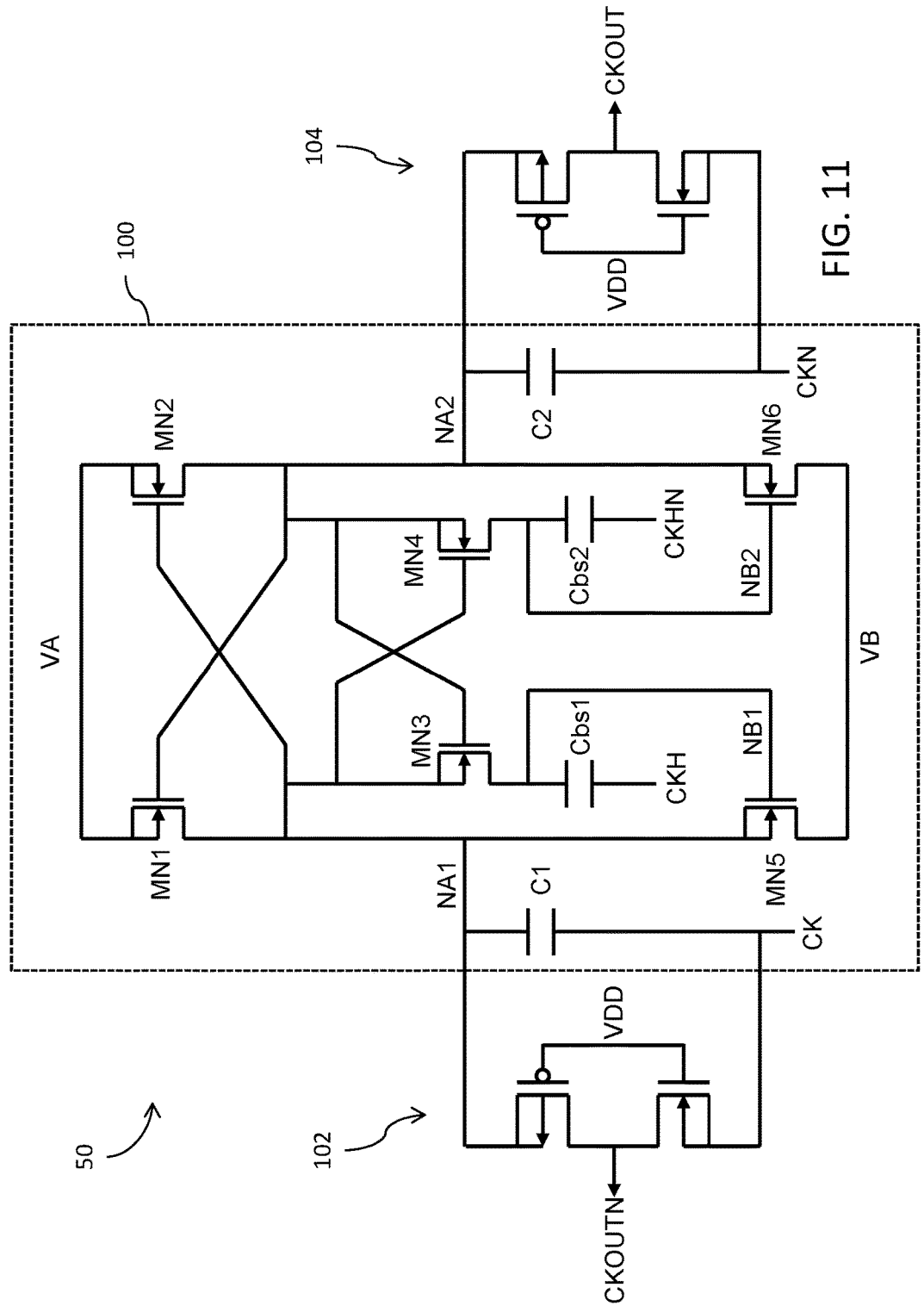
FIG. 11 shows a circuit diagram for a clock level shifter circuit.

Reference is now made to FIG. 11 showing a circuit diagram for a clock level shifter 50. Like reference numbers refer to like or similar components. The clock level shifter 50 differs from the clock level shifter 10 of FIG. 1 with respect to the input and source terminal connections of the first CMOS driver circuit 102 and second CMOS driver circuit 104. The clock level shifter 50 receives an input clock signal CK/CKN that varies between a first set of voltage levels and produces an output clock signal CKOUT/CKOUTN that varies between a second set of voltage levels different from the first set of voltage levels. In an example, the first set of voltage levels may be 0 and VDD volts and the second set of voltage levels may be 0 and 2*VDD volts.

The first CMOS driver circuit 102 is configured as a CMOS inverter having an input coupled to receive the VDD voltage and an output generating the level shifted clock signal CKOUTN. A source terminal of the p-channel MOS transistor in first CMOS driver circuit 102 is coupled to the node NA1 and a source terminal of the n-channel MOS transistor in first CMOS driver circuit 102 is coupled to receive the clock signal CK.

The second CMOS driver circuit 104 is configured as a CMOS inverter having an input coupled to receive the VDD voltage and an output generating the level shifted clock signal CKOUT. A source terminal of the p-channel MOS transistor in second CMOS driver circuit 104 is coupled to the node NA2 and a source terminal of the n-channel MOS transistor in second CMOS driver circuit 104 is coupled to receive the clock signal CKN.

For level shifting the clock signal CK/CKN from the VDD voltage level to generate the level shifted clock signals CKOUT/CKOUTN at the VPOS voltage level, the VDD supply voltage is applied to node VA (the input voltage node). The voltage multiplier circuit 100 operates as a positive voltage doubler (i.e., operating in a high positive voltage mode) and a high positive voltage of 2*VDD is generated at node VB (the output voltage node). This high positive voltage may, for example, be used as an on-chip boosted supply voltage for functional circuits. The level shifted clock signal CKOUT/CKOUTN will vary been 0 volts and 2*VDD volts at a frequency matching the frequency of the clock signal CK/CKN and with an in-phase relationship (wherein CKOUTN is in phase with CK and CKOUT is in phase with CKN). FIG. 12 shows the waveforms for the clock signals CKOUT/CKOUTN.

Figure 13:
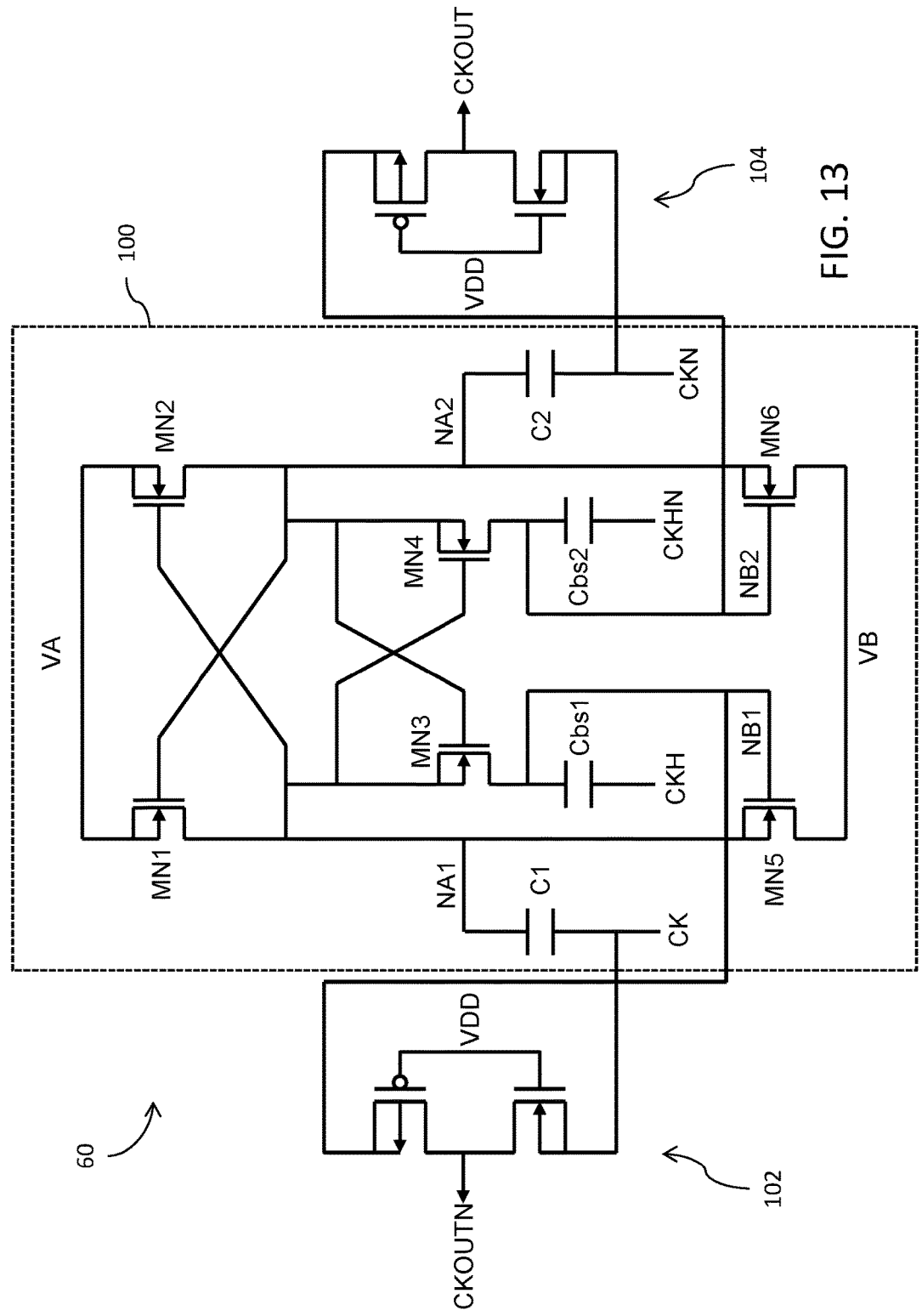
FIG. 13 shows a circuit diagram for a clock level shifter circuit.

Reference is now made to FIG. 13 showing a circuit diagram for a clock level shifter 60. Like reference numbers refer to like or similar components. The clock level shifter 60 differs from the clock level shifter 50 of FIG. 11 with respect to the input and source terminal connections of the first CMOS driver circuit 102 and second CMOS driver circuit 104. The clock level shifter 60 receives an input clock signal CK/CKN that varies between a first set of voltage levels and produces an output clock signal CKOUT/CKOUTN that varies between a second set of voltage levels different from the first set of voltage levels. In an example, the first set of voltage levels may be 0 and VDD volts and the second set of voltage levels may be 0 and 3*VDD volts.

The first CMOS driver circuit 102 is configured as a CMOS inverter having an input coupled to receive the VDD voltage and an output generating the level shifted clock signal CKOUTN. A source terminal of the p-channel MOS transistor in first CMOS driver circuit 102 is coupled to the node NB1 and a source terminal of the n-channel MOS transistor in first CMOS driver circuit 102 is coupled to receive the clock signal CK.

The second CMOS driver circuit 104 is configured as a CMOS inverter having an input coupled to receive the VDD voltage and an output generating the level shifted clock signal CKOUT. A source terminal of the p-channel MOS transistor in second CMOS driver circuit 104 is coupled to the node NB2 and a source terminal of the n-channel MOS transistor in second CMOS driver circuit 104 is coupled to receive the clock signal CKN.

For level shifting the clock signal CK/CKN from the VDD voltage level to generate the level shifted clock signals CKOUT/CKOUTN at the VPOS voltage level, the VDD supply voltage is applied to node VA (the input voltage node). The voltage multiplier circuit 100 operates as a positive voltage doubler (i.e., operating in a high positive voltage mode) and a high positive voltage of 2*VDD is generated at node VB (the output voltage node). This high positive voltage may, for example, be used as an on-chip boosted supply voltage for functional circuits. The level shifted clock signal CKOUT/CKOUTN will vary been 0 volts and 3*VDD volts at a frequency matching the frequency of the clock signal CK/CKN and with an in-phase relationship (where CKOUTN is in phase with CK and CKOUT is in phase with CKN). FIG. 14 shows the waveforms for the clock signals CKOUT/CKOUTN.

The embodiments of FIGS. 11 and 13 are useful in situations where a separately generated or provided VPOS voltage is not available. The level shifting of the clock signal can instead be made to an integer multiple of the VDD voltage. Thus, it will be noted that an advantage of the embodiments of FIGS. 1 and 7 is that a custom selected VPOS voltage can be used for the level shift.

Figure 15:
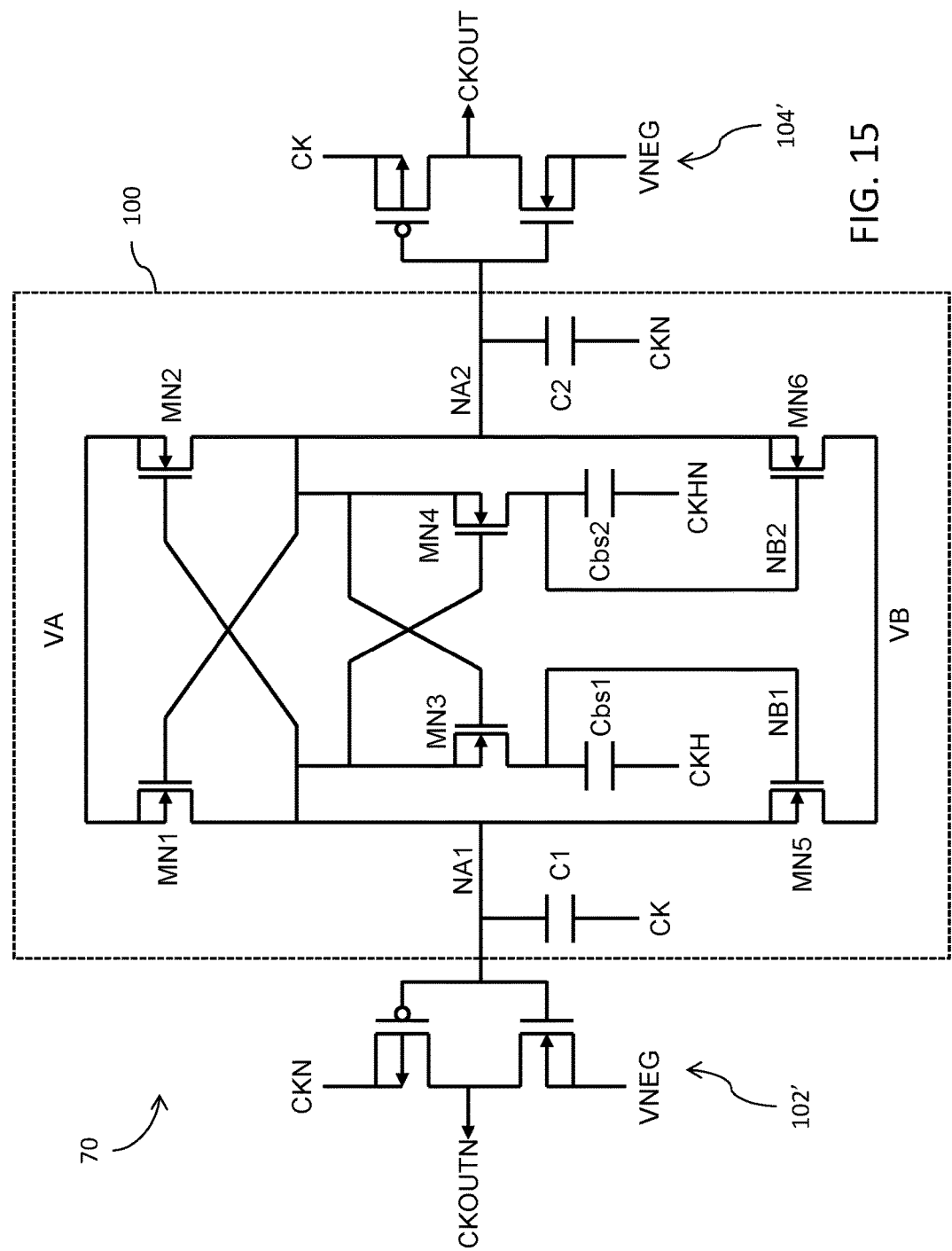
FIG. 15 shows a circuit diagram for a clock level shifter circuit.

Reference is now made to FIG. 15 showing a circuit diagram for a clock level shifter 70. Like reference numbers refer to like or similar components. The clock level shifter 70 differs from the clock level shifter 10 of FIG. 1 with respect to the applied source terminal voltages for the first CMOS driver circuit 102' and second CMOS driver circuit 104' and the applied supply voltage for the multiplier circuit 100. The clock level shifter 70 also differs in that the node VB is the voltage input node and the node VA is the voltage output node. The clock level shifter 70 receives an input clock signal CK/CKN that varies between a first set of voltage levels and produces an output clock signal CKOUT/CKOUTN that varies between a second set of voltage levels different from the first set of voltage levels. In an example, the first set of voltage levels may be 0 and VDD volts and the second set of voltage levels may be VDD and VNEG volts, where VNEG volts is greater than or equal to about −VDD volts.

The first CMOS driver circuit 102' is configured as a CMOS inverter having an input coupled to the node NA1 and an output generating the level shifted clock signal CKOUTN. A source terminal of the p-channel MOS transistor in first CMOS driver circuit 102' is coupled to receive the clock signal CKN and a source terminal of the n-channel MOS transistor in first CMOS driver circuit 102' is coupled to the negative supply voltage VNEG to which the clock is being level shifted.

The second CMOS driver circuit 104' is configured as a CMOS inverter having an input coupled to the node NA2 and an output generating the level shifted clock signal CKOUT. A source terminal of the p-channel MOS transistor in second CMOS driver circuit 104' is coupled to receive the clock signal CK and a source terminal of the n-channel MOS transistor in second CMOS driver circuit 104' is coupled to the negative supply voltage VNEG to which the clock is being level shifted.

For level shifting the clock signal CK/CKN from the VDD voltage level to generate the level shifted clock signals CKOUT/CKOUTN at the VNEG voltage level, the GND supply voltage is applied to node VB (the voltage input node). The voltage multiplier circuit 100 operates as a negative voltage doubler (i.e., operating in a high negative voltage mode) and a high negative voltage of −VDD is generated at node VA (the voltage output node). This high negative voltage may, for example, be used as an on-chip boosted supply voltage for functional circuits. The VNEG voltage level is preferably greater than or equal to −VDD. The level shifted clock signal CKOUT/CKOUTN will vary been VDD volts and VNEG volts at a frequency matching the frequency of the clock signal CK/CKN and with an in-phase relationship (where CKOUTN is in phase with CKN and CKOUT is in phase with CK). FIG. 16 shows the waveforms for the clock signals CKOUT/CKOUTN.

Figure 17:
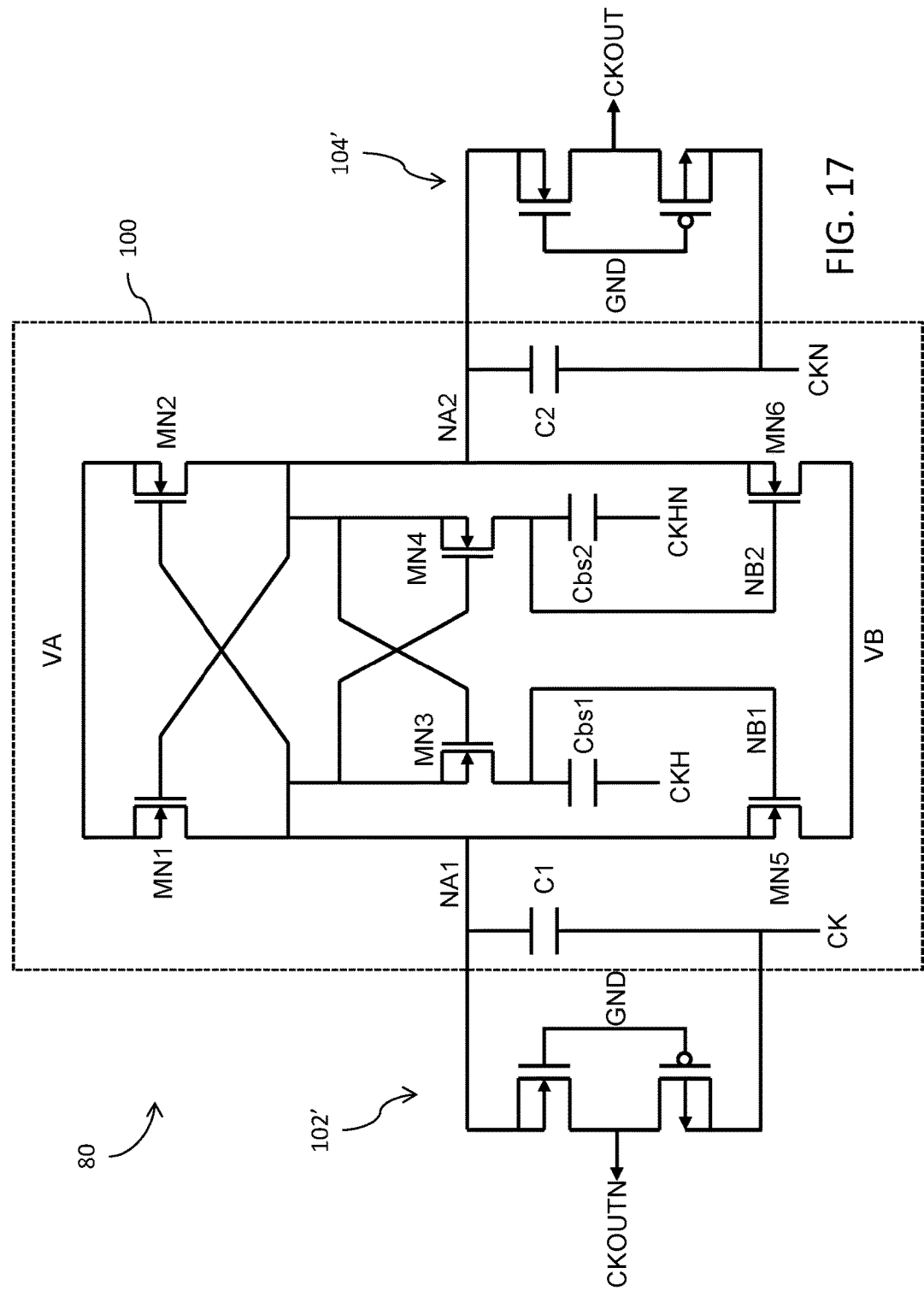
FIG. 17 shows a circuit diagram for a clock level shifter circuit.

Reference is now made to FIG. 17 showing a circuit diagram for a clock level shifter 80. Like reference numbers refer to like or similar components. The clock level shifter 80 differs from the clock level shifter 60 of FIG. 13 with respect to the input and source terminal connections for the first CMOS driver circuit 102' and second CMOS driver circuit 104'. The clock level shifter 80 receives an input clock signal CK/CKN that varies between a first set of voltage levels and produces an output clock signal CKOUT/CKOUTN that varies between a second set of voltage levels different from the first set of voltage levels. In an example, the first set of voltage levels may be 0 and VDD volts and the second set of voltage levels may be VDD and VNEG volts, where VNEG volts is greater than or equal to about −VDD volts.

The first CMOS driver circuit 102' is configured as a CMOS inverter having an input coupled to the ground voltage GND and an output generating the level shifted clock signal CKOUTN. A source terminal of the p-channel MOS transistor in first CMOS driver circuit 102' is coupled to receive the clock signal CK and a source terminal of the n-channel MOS transistor in first CMOS driver circuit 102' is coupled to the node NA1.

The second CMOS driver circuit 104' is configured as a CMOS inverter having an input coupled to the ground voltage GND and an output generating the level shifted clock signal CKOUT. A source terminal of the p-channel MOS transistor in second CMOS driver circuit 104' is coupled to receive the clock signal CKN and a source terminal of the n-channel MOS transistor in second CMOS driver circuit 104' is coupled to the node NA2.

For level shifting the clock signal CK/CKN from the VDD voltage level to generate the level shifted clock signals CKOUT/CKOUTN at the VNEG voltage level, the GND supply voltage is applied to node VB (the input voltage node). The voltage multiplier circuit 100 operates as a negative voltage doubler (i.e., operating in a high negative voltage mode) and a high negative voltage of −VDD is generated at node VA (the output voltage node). This high negative voltage may, for example, be used as an on-chip boosted supply voltage for functional circuits. The VNEG voltage level is preferably greater than or equal to −VDD. The level shifted clock signal CKOUT/CKOUTN will vary been VDD volts and VNEG volts at a frequency matching the frequency of the clock signal CK/CKN and with an in-phase relationship (where CKOUTN is in phase with CKN and CKOUT is in phase with CK). FIG. 18 shows the waveforms for the clock signals CKOUT/CKOUTN.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
    a voltage multiplier circuit having an input voltage node configured to receive a first voltage and an output voltage node configured to generate a second voltage multiplied from said first voltage and including:
        first and second intermediate nodes that are capacitively coupled to receive opposite phases of a first clock signal, respectively, whose voltage varies between a ground voltage and first voltage level; and
        third and fourth intermediate nodes that are capacitively coupled to receive opposite phases of a second clock signal, respectively, whose voltage varies between the ground voltage and a second voltage level greater than the first voltage level;
    a first CMOS driver circuit having an input coupled to said first intermediate node, a first source terminal coupled to receive a level shift voltage, a second source terminal, and an output configured to generate one phase of a third clock signal that is level shifted from said first clock signal; and
    a second CMOS driver circuit having an input coupled to said second intermediate node, a first source terminal coupled to receive said level shift voltage, a second source terminal, and an output configured to generate another phase of the third clock signal that is level shifted from said first clock signal.

2. The circuit of claim 1, wherein the second source terminals of the first and second CMOS driver circuits are configured to receive opposite phases of the first clock signal, and wherein the first voltage at the input voltage node of the voltage multiplier circuit is a positive supply voltage, and wherein the level shift voltage is a positive voltage.

3. The circuit of claim 2, wherein the positive supply voltage is equal to the first voltage level.

4. The circuit of claim 2, wherein the third clock signal has a voltage that varies between the ground voltage and the positive voltage of the level shift voltage.

5. The circuit of claim 1, wherein the second source terminals of the first and second CMOS driver circuits are configured to receive a ground voltage, and wherein the first voltage at the input voltage node of the voltage multiplier circuit is the ground voltage, and wherein the level shift voltage is a negative voltage.

6. The circuit of claim 5, wherein the third clock signal has a voltage that varies between the ground voltage and the negative voltage of the level shift voltage.

7. The circuit of claim 1, wherein the second source terminals of the first and second CMOS driver circuits are configured to receive opposite phases of the first clock signal, and wherein the first voltage at the input voltage node of the voltage multiplier circuit is a ground supply voltage, and wherein the level shift voltage is a negative voltage.

8. The circuit of claim 7, wherein the third clock signal has a voltage that varies between the first voltage level of the first clock signal and the negative voltage of the level shift voltage.

9. The circuit of claim 1, wherein the voltage multiplier circuit comprises a first transistor and second transistor connected in a cross-coupled configuration, wherein the first transistor is coupled between a first node and the first intermediate node and wherein the second transistor is coupled between the first node and the second intermediate node.

10. The circuit of claim 9, wherein the first node is one of the input voltage node or output voltage node.

11. The circuit of claim 9, wherein the voltage multiplier circuit further comprises a third transistor and fourth transistor connected in a cross-coupled configuration, wherein the third transistor is coupled between the first intermediate node and the third intermediate node and wherein the fourth transistor is coupled between the second intermediate node and the fourth intermediate node.

12. The circuit of claim 11, wherein the voltage multiplier circuit further comprises:
    a fifth transistor coupled between the first intermediate node and a second node and having a control terminal coupled to the third intermediate node; and
    a sixth transistor coupled between the second intermediate node and the second node and having a control terminal coupled to the fourth intermediate node.

13. The circuit of claim 12, wherein the second node is one of the input voltage node or output voltage node.

14. A circuit, comprising:
    a voltage multiplier circuit having an input voltage node configured to receive a first voltage and an output voltage node configured to generate a second voltage multiplied from said first voltage and including:
        first and second intermediate nodes that are capacitively coupled to receive opposite phases of a first clock signal, respectively, whose voltage varies between a ground voltage and first voltage level; and
        third and fourth intermediate nodes that are capacitively coupled to receive opposite phases of a second clock signal, respectively, whose voltage varies between the ground voltage and a second voltage level greater than the first voltage level;
    a first CMOS driver circuit having an input coupled to a reference voltage, a first source terminal coupled to one of the first or third intermediate nodes, a second source terminal coupled to receive a phase of the first clock signal, and an output configured to generate one phase of a third clock signal that is level shifted from said first clock signal; and a second CMOS driver circuit having an input coupled to said reference voltage, a first source terminal coupled to one of the second or fourth intermediate nodes, a second source terminal coupled to receive another phase of the first clock signal, and an output configured to generate another phase of the third clock signal that is level shifted from said first clock signal.

15. The circuit of claim 14, wherein the reference voltage is a positive supply voltage, and wherein the first voltage at the input voltage node of the voltage multiplier circuit is the positive supply voltage.

16. The circuit of claim 15, wherein the positive supply voltage is equal to the first voltage level.

17. The circuit of claim 15, wherein the third clock signal has a voltage that varies between a ground voltage and at least two times the positive supply voltage.

18. The circuit of claim 15, wherein the first source terminals of the first and second CMOS driver circuits are coupled to the first and second intermediate nodes, respectively.

19. The circuit of claim 15, wherein the first source terminals of the first and second CMOS driver circuits are coupled to the third and fourth intermediate nodes, respectively.

20. The circuit of claim 14, wherein the reference voltage is a ground voltage, and wherein the first voltage at the input voltage node of the voltage multiplier circuit is the ground voltage.

21. The circuit of claim 20, wherein the third clock signal has a voltage that varies between the first voltage level and a negative of the first voltage level.

22. The circuit of claim 14, wherein the voltage multiplier circuit comprises a first transistor and second transistor connected in a cross-coupled configuration, wherein the first transistor is coupled between a first node and the first intermediate node and wherein the second transistor is coupled between the first node and the second intermediate node.

23. The circuit of claim 22, wherein the first node is one of the input voltage node or output voltage node.

24. The circuit of claim 22, wherein the voltage multiplier circuit further comprises a third transistor and fourth transistor connected in a cross-coupled configuration, wherein the third transistor is coupled between the first intermediate node and the third intermediate node and wherein the fourth transistor is coupled between the second intermediate node and the fourth intermediate node.

25. The circuit of claim 24, wherein the voltage multiplier circuit further comprises:

a fifth transistor coupled between the first intermediate node and a second node and having a control terminal coupled to the third intermediate node; and a sixth transistor coupled between the second intermediate node and the second node and having a control terminal coupled to the fourth intermediate node.

26. The circuit of claim 25, wherein the second node is one of the input voltage node or output voltage node.

27. A circuit, comprising:

a voltage multiplier circuit having an input voltage node configured to receive a first voltage and an output voltage node configured to generate a second voltage multiplied from said first voltage and including:

first and second intermediate nodes that are capacitively coupled to receive opposite phases of a first clock signal, respectively, whose voltage varies between a ground voltage and first voltage level; and third and fourth intermediate nodes that are capacitively coupled to receive opposite phases of a second clock signal, respectively, whose voltage varies between the ground voltage and a second voltage level greater than the first voltage level;

a first CMOS driver circuit having an input coupled to said third intermediate node, a first source terminal coupled to receive a level shift voltage, a second source terminal, and an output configured to generate one phase of a third clock signal that is level shifted from said first clock signal; and a second CMOS driver circuit having an input coupled to said fourth intermediate node, a first source terminal coupled to receive said level shift voltage, a second source terminal, and an output configured to generate another phase of the third clock signal that is level shifted from said first clock signal.

28. The circuit of claim 27, wherein the second source terminals of the first and second CMOS driver circuits are configured to receive opposite phases of the second clock signal, and wherein the first voltage at the input voltage node of the voltage multiplier circuit is a positive supply voltage, and wherein the level shift voltage is a positive voltage.

29. The circuit of claim 28, wherein the positive supply voltage is equal to the first voltage level.

30. The circuit of claim 28, wherein the third clock signal has a voltage that varies between the ground voltage and the positive voltage of the level shift voltage.

31. The circuit of claim 27, wherein the second source terminals of the first and second CMOS driver circuits are configured to receive the first voltage level, and wherein the first voltage at the input voltage node of the voltage multiplier circuit is the ground voltage, and wherein the level shift voltage is a negative voltage.

32. The circuit of claim 31, wherein the third clock signal has a voltage that varies between the first voltage level and the negative voltage of the level shift voltage.

33. The circuit of claim 28, wherein the voltage multiplier circuit comprises a first transistor and second transistor connected in a cross-coupled configuration, wherein the first transistor is coupled between a first node and the first intermediate node and wherein the second transistor is coupled between the first node and the second intermediate node.

34. The circuit of claim 33, wherein the first node is one of the input voltage node or output voltage node.

35. The circuit of claim 33, wherein the voltage multiplier circuit further comprises a third transistor and fourth transistor connected in a cross-coupled configuration, wherein the third transistor is coupled between the first intermediate node and the third intermediate node and wherein the fourth transistor is coupled between the second intermediate node and the fourth intermediate node.

36. The circuit of claim 35, wherein the voltage multiplier circuit further comprises:

a fifth transistor coupled between the first intermediate node and a second node and having a control terminal coupled to the third intermediate node; and a sixth transistor coupled between the second intermediate node and the second node and having a control terminal coupled to the fourth intermediate node.

37. The circuit of claim 36, wherein the second node is one of the input voltage node or output voltage node.

* * * * *